United States Patent
Hung et al.

(10) Patent No.: US 7,514,761 B2
(45) Date of Patent: Apr. 7, 2009

(54) TRIPLE OPERATION VOLTAGE DEVICE

(75) Inventors: Tz-Ian Hung, Hsinhua (TW);
Ming-Cheng Chiu, Hsinhua (TW);
Chan-Liang Wu, Hsinhua (TW)

(73) Assignee: Himax Technologies, Inc., Tainan County (TW)

( * ) Notice: Subject to any disclaimer, the term of this patent is extended or adjusted under 35 U.S.C. 154(b) by 444 days.

(21) Appl. No.: 11/270,192

(22) Filed: Nov. 8, 2005

(65) Prior Publication Data

US 2007/0102782 A1    May 10, 2007

(51) Int. Cl.
*H01L 29/00* (2006.01)
(52) U.S. Cl. .................... 257/500; 257/350; 257/499; 257/513
(58) Field of Classification Search .............. 257/500, 257/360, 315
See application file for complete search history.

(56) References Cited

U.S. PATENT DOCUMENTS

| | | | | |
|---|---|---|---|---|
| 5,239,197 | A * | 8/1993 | Yamamoto | 257/500 |
| 6,091,111 | A * | 7/2000 | Demirlioglu et al. | 257/344 |
| 6,265,752 | B1 * | 7/2001 | Liu et al. | 257/487 |
| 6,349,067 | B1 * | 2/2002 | Hsu et al. | 365/206 |
| 6,433,392 | B1 | 8/2002 | Amerasekera et al. | 257/355 |
| 6,670,245 | B2 | 12/2003 | Yu | 438/275 |
| 7,005,708 | B2 * | 2/2006 | Mergens et al. | 257/360 |
| 7,205,630 | B2 * | 4/2007 | Chang et al. | 257/500 |
| 2004/0159856 | A1 * | 8/2004 | Tada et al. | 257/200 |
| 2004/0256658 | A1 * | 12/2004 | Park et al. | 257/315 |

\* cited by examiner

*Primary Examiner*—N Drew Richards
*Assistant Examiner*—Mamadou Diallo
(74) *Attorney, Agent, or Firm*—J.C. Patents

(57) ABSTRACT

A triple operation voltage device including a first type substrate, a high voltage (HV) first type well, a second type well, a low voltage (LV) device well, and a middle voltage (MV) device well is provided. The HV first type well is disposed inside the first type substrate. The second type well is disposed inside the first type substrate to separate the HV first type well from the first type substrate. The LV device well and the MV device well are separately disposed inside the HV first type well by the separation of the HV first type well. The triple operation voltage device assists in reducing the space between the LV device well and the MV device well and improving the integration of integrated circuits.

12 Claims, 3 Drawing Sheets ness of the P-type substrate 110 there between may be 4 μm.

TRIPLE OPERATION VOLTAGE DEVICE

BACKGROUND OF THE INVENTION

1. Field of the Invention

The present invention generally relates to a semiconductor device. More particularly, the present invention relates to a triple operation voltage device.

2. Description of Related Art

Due to different electrical properties required for different operation voltages, semiconductor devices such as triple operation voltage devices operated in high voltage, middle voltage and low voltage are not rare in the integrated circuits. In order to increase integration of the device, it is necessary to apply a production process of a smaller size. Furthermore, anti-punch-through doping or multi-step well doping must be applied to prevent the leakage current in the triple operation voltage device.

FIG. 1A is a schematic top view of a conventional triple operation voltage device, and FIG. 1B is a schematic cross-sectional view of the conventional triple operation voltage device in FIG. 1A. As shown in FIGS. 1A and 1B, the LV device well 130 and the MV device well 140 are separately isolated by an N-type buried layer 122 and a high voltage (HV) N-type well 124 in the P-type substrate 110.

The LV device well 130 and the MV device well 140 are separated by their corresponding HV N-type well 124 for the prevention of the leakage current. However, it should be noted that the space between the LV device well 130 and the MV device well 140 is limited by the width of the HV N-type wells 124 and the P-type substrate 110 there between. For example, the width of each HV N-type well 124 may be 7 μm and the width of the P-type substrate 110 there between may be 4 μm. Thus, the space between the LV device well 130 and the MV device well 140 is about 18 μm. Therefore, the layout area of the triple operation voltage device can't further be reduced and the integration of the integrated circuits is restricted.

SUMMARY OF THE INVENTION

The purpose of the invention is to reduce the layout area of the triple operation voltage device and improve the integration of the integrated circuits.

With regard to the aforementioned or other purposes, a triple operation voltage device is provided. The triple operation voltage device comprises a first type substrate, a high voltage (HV) first type well disposed inside the first type substrate, a second type well disposed inside the first type substrate to separate the HV first type well from the first type substrate, a low voltage (LV) device well disposed inside the HV first type well, and a middle voltage (MV) device well disposed inside the HV first type well, wherein the LV device well and the MV device well are separated by the HV first type well.

According to an embodiment of the invention, the low voltage (LV) is between 0 and 4.5 volts, the middle voltage (MV) is between 4.5 and 12 volts, and the high voltage (HV) is between 12 and 50 volts.

According to an embodiment of the invention, the first type is a P-type and the second type is an N-type.

According to an embodiment of the invention, the first type is an N-type and the second type is a P-type.

According to an embodiment of the invention, the second type well comprises a deep second type well.

According to an embodiment of the invention, the second type well comprises a second type buried layer disposed below the HV first type well and a HV second type well disposed around the HV first type well.

According to an embodiment of the invention, the LV device well or the MV device well may comprise a first type well disposed inside the HV first type well, wherein the doping concentration of the first type well is less than that of the HV first type well, a second type first doped region disposed inside the first type well, a second type second doped region disposed inside the first type well, and an isolation structure disposed between the second type first doped region and the second type second doped region. The isolation structure may be a local oxidation region or a shallow trench isolation structure.

Accordingly, instead of being isolated by individual second type wells, the LV device well and the MV device well are disposed in and separated by an HV first type well. Thus, the space between the LV device well and the MV device well can be reduced for attaining the reduction of the layout area.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
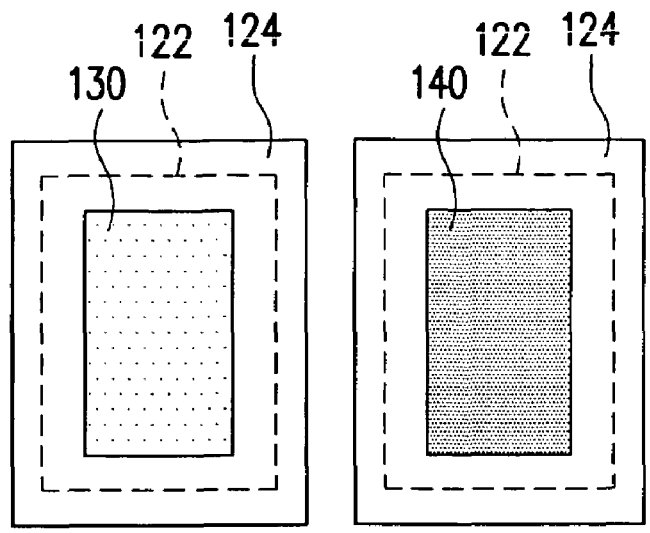
FIG. 1A is a schematic top view of a conventional triple operation voltage device.

Reference will now be made in detail to the present preferred embodiments of the invention, examples of which are illustrated in the accompanying drawings. Wherever possible, the same reference numbers are used in the drawings and the description to refer to the same or like parts.

The present invention provides a triple operation voltage device with a lower layout area to serve in any applicable integrated circuits. In particular, although the first conductive type is assumed to be a P-type and the second conductive type is assumed to be an N-type in the following embodiment, the first conductive type can be an N-type and the second conductive type can be a P-type according to the spirit of the present invention.

Figure 2A:
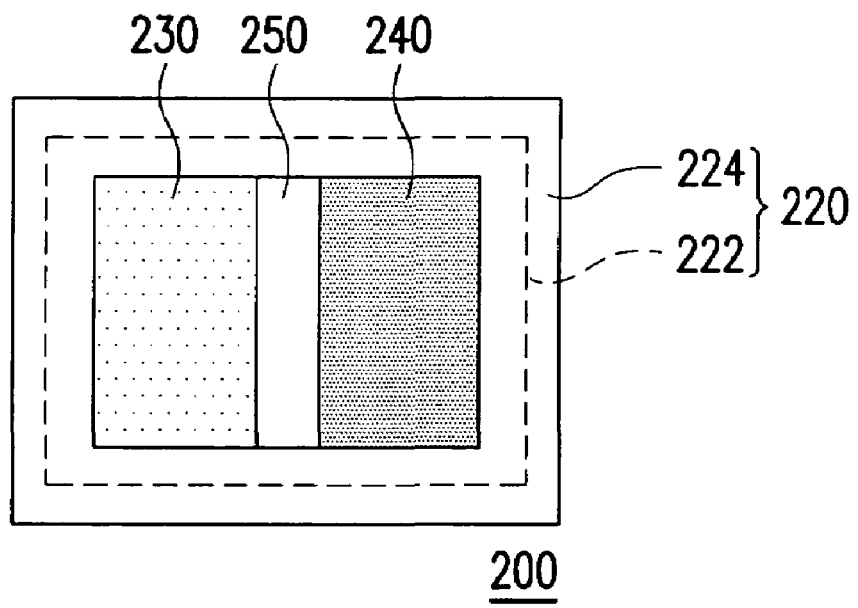
FIG. 2A is a schematic top view of a triple operation voltage device according to the present invention.
Figure 2B:
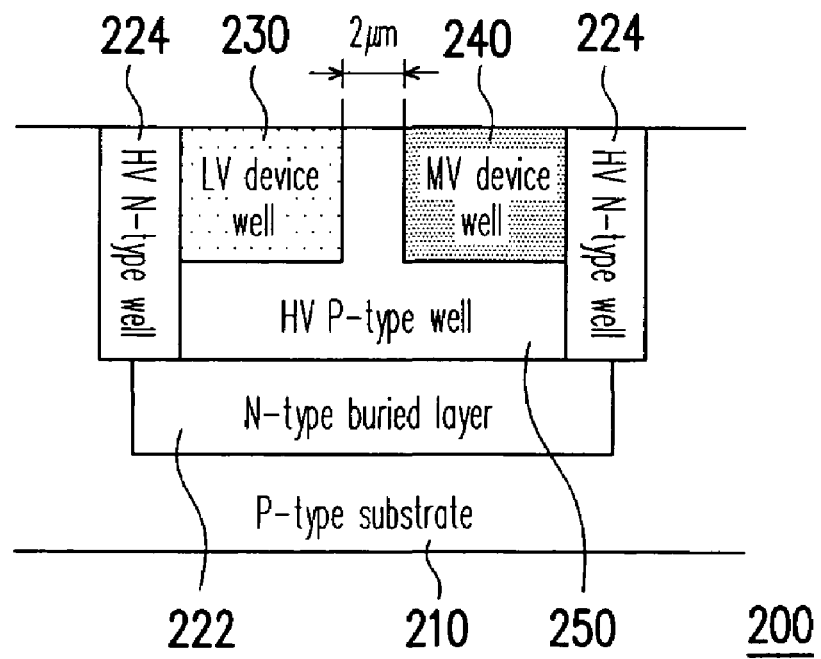
FIG. 2B is a schematic cross-sectional view of the triple operation voltage device in FIG. 2A.

FIG. 2A is a schematic top view of a triple operation voltage device according to the present invention, and FIG. 2B is a schematic cross-sectional view of the triple operation voltage device in FIG. 2A. As shown in FIGS. 2A and 2B, the triple operation voltage device 200 comprises a P-type substrate 210, a high voltage (HV) P-type well 250, an N-type well 220, a low voltage (LV) device well 230 and a middle voltage (MV) device well 240. The HV P-type well 250 is disposed inside the P-type substrate 210, wherein the concentration of dopants in the HV P-type well 250 is greater than that in the P-type substrate 210.

The N-type well 220 is formed inside the P-type substrate 210 to separate the HV P-type well 250 from the P-type substrate 210. The N-type well 220 prevents current from directly impinging the P-type substrate 210 to cause the triple operation voltage device 200 failure due to a large depletion region in the N-type well 220. In an embodiment, the N-type well 220 may comprise an N-type buried layer 222 disposed below the HV P-type well 250 and an HV N-type well 224 disposed around the HV P-type well 250. In other embodiments, the N-type well 220 can further be a deep N-type well, which has high concentration N-type dopants.

Figure 1B:
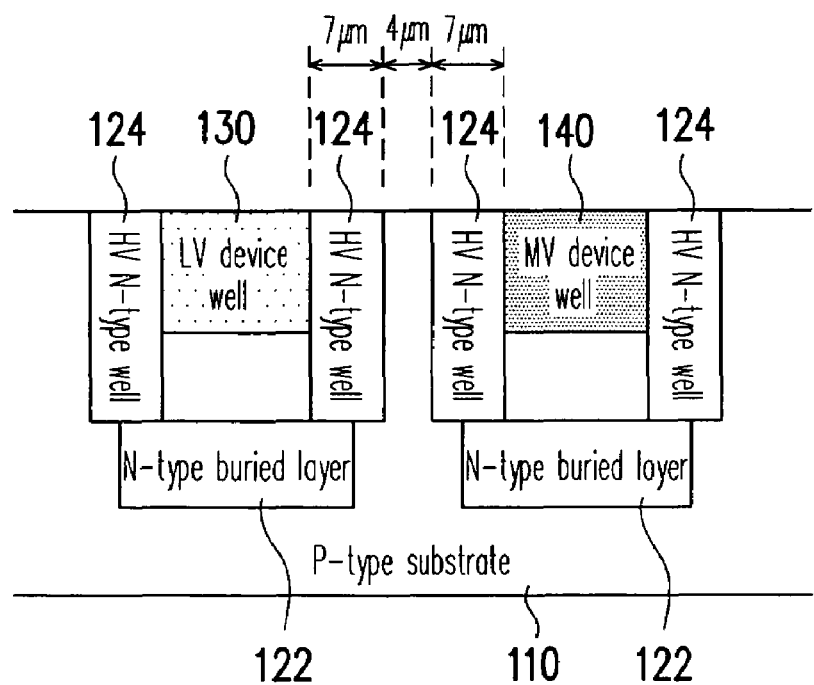
FIG. 1B is a schematic cross-sectional view of the conventional triple operation voltage device in FIG. 1A.

The LV device well 230 are separately disposed inside the HV first type well 250, wherein the LV device well 230 and the MV device well 240 are separated by the HV P-type well 250. Without any HV N-well 124 for separating the LV device well 130 and the MV device well 140 as shown in FIGS. 1A and 1B, the space between the LV device well 230 and the MV device well 240 can be reduced to 2 µm for example. In addition, the operation voltages of the triple operation voltage device 200 may be 0~4.5 volts (LV), 4.5~12 volts (MV) and 12~50 volts (HV), and the better range definition is 1.5~3.6 volts (LV), 5~8 volts (MV), and 20~40 volts (HV). However, there is no set limit on the operation voltages of the triple operation voltage device 200. Furthermore, it should be noted that the doping concentration should be adjusted as forming the LV device well 230 and the MV device well 240 in the high doped HV P-type well 250.

Figure 3:
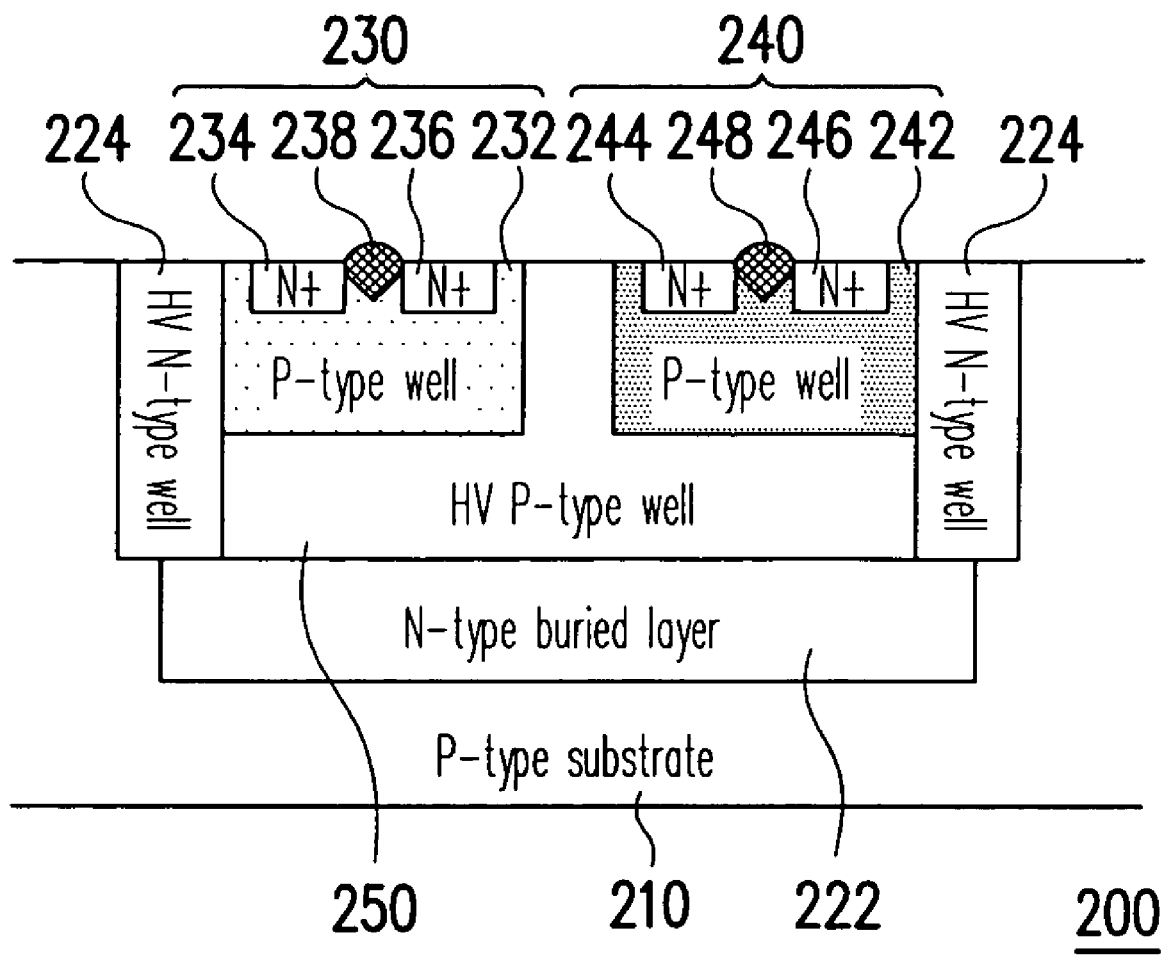
FIG. 3 is a more detail cross-sectional view of the triple operation voltage device in FIG. 2A according to an embodiment of the present invention.

Referring to FIG. 3, which is a more detail cross-sectional view of the triple operation voltage device in FIG. 2A according to an embodiment of the present invention. In the embodiment, the LV device well 230 may comprise a P-type well 232, an N-type first doped region 234, an N-type second doped region 236 and an isolation structure 238. The P-type well 232 is disposed inside the HV P-type well 250, wherein the concentration of dopants in the P-type well 232 is less than that in the HV P-type well 250. The N-type first doped region 234 and the N-type second doped region 236 are separately disposed inside the P-type well 232. In addition, the isolation structure 238 is disposed between the N-type first doped region 234 and the N-type second doped region 236 to prevent the formation of a channel between the N-type first doped region 234 and the N-type second doped region 236 which may lead to the triple operation voltage device 200 failure.

In addition, the MV device well 240 may comprise a P-type well 242, an N-type first doped region 244, an N-type second doped region 246 and an isolation structure 248. The P-type well 242 is disposed inside the HV P-type well 250, wherein the concentration of dopants in the P-type well 242 is less than that in the HV P-type well 250. The N-type first doped region 244 and the N-type second doped region 246 are separately disposed inside the P-type well 242. In addition, the isolation structure 248 is disposed between the N-type first doped region 244 and the N-type second doped region 246 to prevent the formation of a channel between the N-type first doped region 244 and the N-type second doped region 246.

The isolation structures 238 and 248 are, for example, shallow trench isolation (STI) structures or local oxidation regions formed by performing a local oxidation process.

In summary, the LV device well and the MV device well of the triple operation voltage device are surrounded by a common HV second type well and separated by a common HV first type well. Therefore, the space between the LV device well and the MV device well can be reduced for the reduction of the layout area of the triple operation voltage device. Then, the integration of the integrated circuits is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A triple operation voltage device comprising:
a first type substrate;
a high voltage (HV) first type well disposed inside the first type substrate, wherein the concentration of dopants in the HV first type well is greater than that in the first type substrate;
a second type well disposed inside the first type substrate to separate the HV first type well from the first type substrate;
a low voltage (LV) device well disposed inside the HV first type well; and
a middle voltage (MV) device well disposed inside the MV first type well, wherein the LV device well and the MV device well are separated by the HV first type well.

2. The triple operation voltage device according to claim 1, wherein the first type is a P-type and the second type is an N-type.

3. The triple operation voltage device according to claim 1, wherein the first type is an N-type and the second type is a P-type.

4. The triple operation voltage device according to claim 1, wherein the second type well comprises a deep second type well.

5. The triple operation voltage device according to claim 1, wherein the second type well comprises a second type buried layer disposed below the HV first type well and an HV second type well disposed around the HV first type well.

6. The triple operation voltage device according to claim 1, wherein the LV device well comprises:
first type well disposed inside the HV first type well, wherein the doping concentration of the first type well is less than that of the HV first type well;
a second type first doped region disposed inside the first type well;
a second type second doped region disposed inside the first type well; and
an isolation structure disposed between the second type first doped region and the second type second doped region.

7. The triple operation voltage device according to claim 6, wherein the isolation structure is a local oxidation region.

8. The triple operation voltage device according to claim 6, wherein the isolation structure is a shallow trench isolation structure.

9. The triple operation voltage device according to claim 1, wherein the MV device well comprises:
a first type well disposed inside the HV first type well, wherein the doping concentration of the first type well is less than that of the HV first type well;
a second type first doped region disposed inside the first type well;
a second type second doped region disposed inside the first type well; and
an isolation structure disposed between the second type first doped region and the second type second doped region.

10. The triple operation voltage device according to claim 9, wherein the isolation structure is a local oxidation region.

11. The triple operation voltage device according to claim 9, wherein the isolation structure is a shallow trench isolation structure.

12. The triple operation voltage device according to claim 1, wherein the low voltage (LV) is between 0 and 4.5 volts, the middle voltage (MV) is between 4.5 and 12 volts, and the high voltage (HV) is between 12 and 50 volts.

* * * * *